US011651944B2

(12) United States Patent
Okamura et al.

(10) Patent No.: US 11,651,944 B2
(45) Date of Patent: May 16, 2023

(54) FILM PROCESSING METHOD AND FILM MANUFACTURING METHOD

(71) Applicant: TOPPAN PRINTING CO., LTD., Tokyo (JP)

(72) Inventors: Kengo Okamura, Tokyo (JP); Ken Takahara, Tokyo (JP); Takahiro Hayakawa, Tokyo (JP); Michihiro Hanami, Tokyo (JP); Takayuki Tani, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 19 days.

(21) Appl. No.: 16/728,550

(22) Filed: Dec. 27, 2019

(65) Prior Publication Data

US 2020/0144038 A1 May 7, 2020

Related U.S. Application Data

(63) Continuation of application No. PCT/JP2018/021377, filed on Jun. 4, 2018.

(30) Foreign Application Priority Data

Jun. 30, 2017 (JP) .............................. JP2017-129631

(51) Int. Cl.
*H01J 37/34* (2006.01)
*C23C 14/35* (2006.01)
*H01J 37/32* (2006.01)

(52) U.S. Cl.
CPC .......... *H01J 37/3405* (2013.01); *C23C 14/35* (2013.01); *H01J 37/32568* (2013.01);
(Continued)

(58) Field of Classification Search
CPC ..... C23C 14/022; C23C 14/35; C23C 14/562; H01J 37/32568; H01J 37/3277;
(Continued)

(56) References Cited

U.S. PATENT DOCUMENTS 4,547,260 A * 10/1985 Takada ................. H01L 21/302
204/192.35
5,491,505 A * 2/1996 Suzuki ................. B41J 2/14129
347/171
(Continued)

FOREIGN PATENT DOCUMENTS

JP 57-135836 * 8/1982
JP H11-116702 A 4/1999
(Continued)

OTHER PUBLICATIONS

Machine Translation JP 11-116702. (Year: 1999).*
(Continued)

*Primary Examiner* — Rodney G McDonald
(74) *Attorney, Agent, or Firm* — Foley & Lardner LLP

(57) ABSTRACT

A treatment method performed by a film processing apparatus including: a first discharge electrode unit and a second discharge electrode unit respectively including magnets that form a magnetic field; and an AC power source capable of alternately switching polarities of the first discharge electrode unit and the second discharge electrode unit. In the treatment method, a predetermined surface treatment of a film F is performed by generating a plasma P while alternately switching polarities of the first discharge electrode unit and the second discharge electrode unit by using high-frequency power supplied from the AC power source.

20 Claims, 4 Drawing Sheets

(52) U.S. Cl.
CPC ... *H01J 37/345* (2013.01); *H01J 2237/20221* (2013.01); *H01J 2237/332* (2013.01)

(58) Field of Classification Search
CPC ...... H01J 37/34; H01J 37/3405; H01J 37/345; H01J 2237/20221; H01J 2237/332; H05H 1/46
USPC ...................................... 118/718; 204/298.24
See application file for complete search history.

(56) References Cited

U.S. PATENT DOCUMENTS

| | | | | |
|---|---|---|---|---|
| 6,231,727 | B1* | 5/2001 | Vanden Brande | H01J 37/3438 204/298.34 |
| 7,806,981 | B2* | 10/2010 | Fayet | H01J 37/3405 118/718 |
| 8,425,738 | B2* | 4/2013 | Hoffman | C23C 14/562 204/192.23 |
| 2006/0177599 | A1* | 8/2006 | Madocks | H05H 1/46 427/569 |
| 2013/0098757 | A1 | 4/2013 | Ohno et al. | |

FOREIGN PATENT DOCUMENTS

| | | | |
|---|---|---|---|
| JP | 2001-288569 | A | 10/2001 |
| JP | 2005-290550 | A | 10/2005 |
| JP | 2008-138229 | A | 6/2008 |
| JP | 2013-136803 | A | 7/2013 |
| JP | 2016-186106 | A | 10/2016 |
| WO | WO 2016089427 | * | 6/2016 |

OTHER PUBLICATIONS

Machine Translation JP 57-135836 (Year: 1982).*
International Searching Authority, "International Search Report," issued in connection with International Patent Application No. PCT/JP2018/021377, dated Aug. 14, 2018.
International Searching Authority, "Written Opinion," issued in connection with International Patent Application No. PCT/JP2018/021377, dated Aug. 14, 2018.
Extended European Search Report dated Jun. 16, 2020 for corresponding European Patent Application No. 18824625.0.

* cited by examiner

FILM PROCESSING METHOD AND FILM MANUFACTURING METHOD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2018/021377, filed on Jun. 4, 2018, which is based upon and claims the benefit of priority to Japanese Patent Application No. 2017-129631, filed on Jun. 30, 2017; the disclosures of which are all incorporated herein by reference in their entireties.

TECHNICAL FIELD

The present invention relates to a film processing method and a film manufacturing method.

BACKGROUND ART

PTL 1 discloses an example of a method of manufacturing a vapor deposition film. In the method of manufacturing a vapor deposition film, as a pretreatment for vapor deposition, plasma processing using a discharge electrode of a planar magnetron system is performed, while a substrate film is continuously fed.

Citation List] [Patent Literature] [PTL 1] JP 2016-186106 A

SUMMARY OF THE INVENTION

Technical Problem

However, in the treatment method described in PTL 1, a high voltage such as a cathode drop voltage is less likely to be induced on a film surface, and thus the drop voltage tends to become small. Furthermore, in DC (direct current) magnetron discharge, since a magnetron electrode is generally a negative electrode (cathode) and many ions and electrons such as argon (Ar) are present together in the vicinity of a cathode electrode, plasma density is high towards the cathode electrode, and the plasma density decreases as the distance from the cathode electrode increases. In some cases, therefore, a predetermined processing (plasma processing) of the film cannot be efficiently performed. Furthermore, the DC magnetron discharge causes the cathode electrode to always be a negative electrode (cathode), and thus electric charges concentrates on an insulating layer or the like deposited on a non-erosion portion or the like of a surface of the cathode electrode. For this reason, there is a possibility that abnormal discharge such as arc discharge may occur, and a plasma processing operation may become unstable especially when high electrical power is supplied or when discharged for a long period of time.

An object of the present invention is to provide a film processing method that can improve film throughput and allow a stable plasma processing operation, and a film manufacturing method.

Solution to Problem

As an aspect, the present invention relates to a film processing method. The film processing method includes the steps of: preparing a plasma processing apparatus including a first discharge electrode unit and a second discharge electrode unit, and an AC (alternating current) power source, the first discharge electrode unit and the second discharge electrode unit each including a magnet that produces a magnetic field, the AC power source being electrically connected to the first discharge electrode unit and the second discharge electrode unit and being capable of alternately switching polarities of the first discharge electrode unit and the second discharge electrode unit; and performing surface treatment of a film to be processed using a plasma by supplying high-frequency power from the AC power source to the first discharge electrode unit and the second discharge electrode unit to generate the plasma in the plasma processing apparatus and conveying the film through the plasma processing apparatus. In the film processing method, the surface treatment of the film is performed by generating a plasma while alternately switching polarities of the first discharge electrode unit and the second discharge electrode unit by using high-frequency power supplied from the AC power source (e.g., using either a sine wave or a rectangular wave).

In the film processing method, the two discharge electrode units are used to generate a plasma used for film processing, to thereby supply high-frequency AC power to these discharge electrode units. According to the method, since polarities of the electrode units are alternately switched in a predetermined period, charge-up from an electric charge generated by the insulating layer or the like deposited on an electrode surface is suppressed, and thus arcing is less likely to occur. Further, since charge-up is suppressed, higher electrical power can be supplied to each discharge electrode unit, so that the number of ions increases in a plasma irradiated to a film surface, and the process can proceed more easily. Therefore, the film processing method according to the present invention can improve film throughput and allow a stable plasma processing operation. In the surface treatment method, the plasma is generated between the first discharge electrode unit and the second discharge electrode unit, and the magnetic field formed by the magnets generates a plasma in a bridge shape so as to approach the film. That is, according to the above-described treatment method, reduction of plasma density in the vicinity of the film can be suppressed compared with the direct current method.

In the film processing method, the frequency of high-frequency power may be in the range of 1 kHz or more and 400 kHz or less, or may be in the range of 10 kHz or more and 100 kHz or less. In this case, since polarities of the first discharge electrode unit and the second discharge electrode unit are preferably switched, charge-up of each discharge electrode unit is preferably suppressed. Accordingly, abnormal discharge such as arc discharge does not occur, and high electrical power can be supplied.

In the film processing method, the first discharge electrode unit and the second discharge electrode unit each may include a plate electrode, and the first discharge electrode unit and the second discharge electrode unit may be arranged in parallel. In this case, a plate-shaped (so-called planar-type) magnetron plasma processing apparatus can be used which facilitates simplification of the apparatus configuration. Further, since the film to be processed is processed in a flat condition, the treatment can be more uniform. In addition, the film is exposed to a plasma for a longer period of time than when the film is conveyed on a roll and subjected to the treatment, and this allows more efficient treatment. Instead of the plate-shaped magnetron plasma processing apparatus, the plasma processing apparatus used in this case may be a cylindrical (so-called rotary-type) magnetron plasma processing apparatus. In this case, the first discharge electrode unit and the second discharge electrode unit may include a cylindrical electrode.

In the film processing method described above, the AC power source may supply predetermined power to the first discharge electrode unit and the second discharge electrode unit such that an electrode width in a film width direction and the plasma processing intensity Epd, used for plasma processing, per processing speed are 100 [W·s/m²] or more, and preferably 200 [W·s/m²] or more. In this case, by supplying higher power to the discharge electrode units, the number of ions increases in a plasma irradiated to a film surface, and the film to be processed can be processed more reliably. The plasma processing intensity Epd can be expressed by the following equation (1) or (2), where the treatment power [W] represents power from the AC power source, the electrode width [m] in a film feeding direction/electrode area [m²] represents an electrode width/electrode area of the discharge electrode unit, and the processing speed [m/s] represents a conveying speed of the film to be subjected to the treatment.

[Equation 1]

$$Epd[W \cdot s/m^2] = \frac{\text{Treatment power}[W] \times \text{Electrode width (film feeding direction)}[m] + \text{Processing speed}[m/s]}{\text{Electrode area}[m^2]} \quad (1)$$

$$= \frac{\text{Treatment power }[W]}{\text{Electrode width (film feeding direction)}[m] \times \text{Processing speed}[m/s]} \quad (2)$$

According to another aspect of the present invention, there is provided a method of manufacturing a film, the method of manufacturing the film comprising a step of performing a pretreatment for vapor deposition on the film by any of the above-described film processing methods, and a step of forming a vapor-deposited layer on a processing surface of the film subjected to the step of performing pretreatment for vapor deposition. As another example of a film manufacturing method, the film manufacturing method may include the steps of: performing pretreatment for lamination of another layer on the film by any of the film processing methods described above; and laminating another layer on a treatment surface of the film subjected to the step of performing pretreatment for lamination. In any of the manufacturing methods, it is preferable that an adhesive strength between the film and the vapor-deposited layer or another layer is not less than 3 N/15 mm under the normal condition (Dry), and not less than 1 N/15 mm under the condition with application of water (Wet), as measured in accordance with JIS K 6854-2 (180-degree peel) and JIS K 6854-3 (T-peel).

As still another aspect, the present invention relates to a film processing apparatus. The treatment apparatus is the plasma processing apparatus used in any of the film processing methods described above, and includes a box, a first discharge electrode unit and a second discharge electrode unit, and an AC power source. The box has an inlet and an outlet through which a film conveyed is fed in and out of the plasma processing apparatus. The first discharge electrode unit and the second discharge electrode unit are arranged in the box and each include a magnet that produces a magnetic field. The AC power source is electrically connected to the first discharge electrode unit and the second discharge electrode unit and is capable of alternately switching polarities of the first discharge electrode unit and the second discharge electrode unit. The plasma processing apparatus can achieve miniaturization of a treatment apparatus including a vapor deposition apparatus and the like and stabilization of operation of the treatment apparatus. The box may be housed in a vacuum chamber, or the box itself may have a function as a vacuum chamber. Thus, an exhaust system may be placed in the box containing the first discharge electrode unit and the second discharge electrode unit so that a pressure in the box can be set separately from other chambers.

In the above-described film processing apparatus, the first discharge electrode unit and the second discharge electrode unit may each include a plate electrode, and the first discharge electrode unit and the second discharge electrode unit may be arranged in parallel. In this case, a plate-shaped magnetron plasma processing apparatus can be used, and thus the apparatus configuration can be simplified.

Advantageous Effects of the Invention

The present invention can provide a film processing method that improves film throughput and allows a stable plasma processing operation, and a film manufacturing method.

BRIEF DESCRIPTION OF THE DRAWINGS

FIGS. 1A and 1B show switching states.

DETAILED DESCRIPTION OF REPRESENTATIVE EMBODIMENTS

Figure 1A:
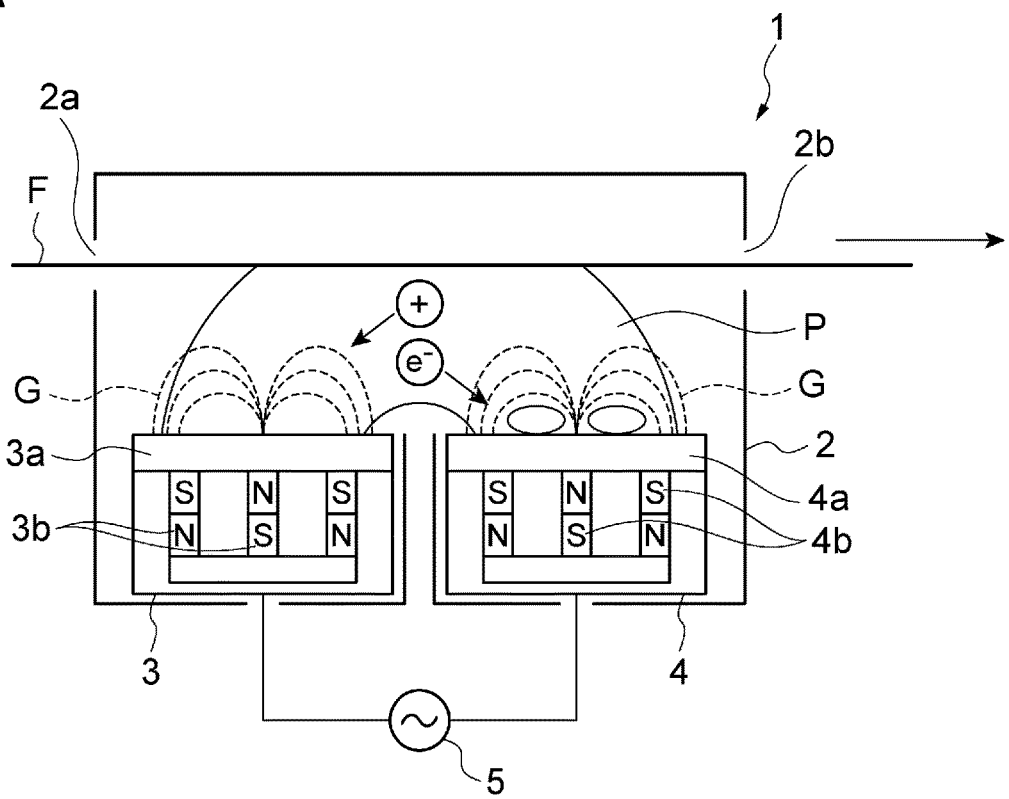
FIGS. 1A and 1B are schematic cross-sectional views schematically showing a film processing apparatus (plasma processing apparatus) used in a film processing method according to an embodiment of the present invention.

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

Figure 1B:
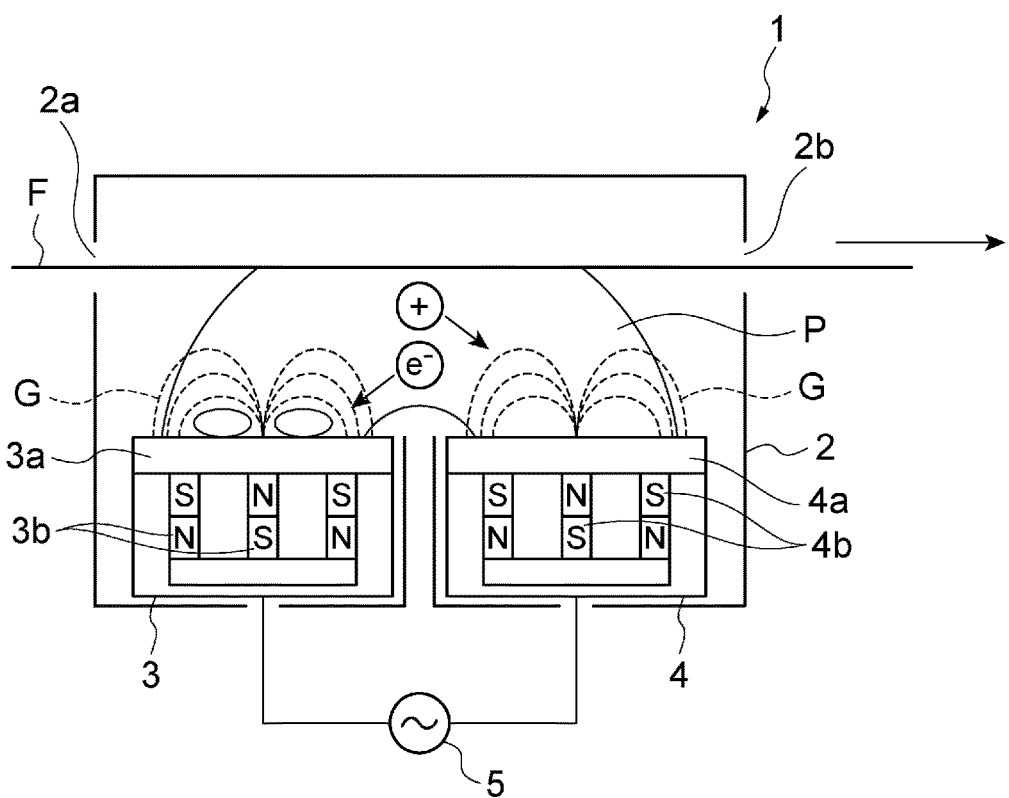

FIGS. 1A and 1B are schematic cross-sectional views schematically showing a film processing apparatus (plasma processing apparatus) used in a film processing method according to an embodiment of the present invention. As shown in FIGS. 1A and 1B, a film processing apparatus 1 used in the present embodiment is a magnetron plasma processing apparatus that is arranged, for example, in a vacuum apparatus and in which when an AC voltage is applied to two magnetron cathodes, the magnetron cathodes each discharge. The film processing apparatus 1 includes a box 2, a first discharge electrode unit 3 and a second discharge electrode unit 4 arranged in parallel in the box 2, and an AC power source 5 electrically connected to the first discharge electrode unit 3 and the second discharge electrode unit 4. A film F to be processed is inserted into the film processing apparatus 1, and is subjected to predetermined surface treatment using a plasma P generated inside the apparatus. The magnetron plasma processing apparatus is an apparatus that performs ion etching and the like (including amorphization of a substrate surface, a change in functional group, and the like) by producing a magnetic field G using magnets (S-pole, N-pole) arranged on back surfaces of electrodes and generating a high-density plasma. The first discharge electrode unit 3 and the second discharge electrode unit 4 are arranged in parallel in a direction (TD, referred to as a "film width direction", a direction orthogonal to the plane in FIGS. 1A and 1B) orthogonal to a film F feeding direction (MD, a horizontal direction in FIGS. 1A and 1B). Since the first discharge electrode unit 3 and the second discharge electrode unit 4 are designed so that an electrode width in the film width direction is equal to or greater than a width of the film F, an entire surface of the film can be uniformly treated.

The box 2 is disposed in the vacuum device as described above, and the inside thereof is in a predetermined pressure reduced state. The box 2 is provided with an inlet 2a and an outlet 2b so that the film F to be subjected to the surface treatment by the plasma P can be inserted and conveyed.

The first discharge electrode unit 3 and the second discharge electrode unit 4 are each an electrode unit of a plate-shaped (planar-type) magnetron plasma processing apparatus, and respectively include plate-shaped electrodes 3a and 4a (plate electrodes) and magnets 3b and 4b that are arranged on a back side of the plate-shaped electrodes 3a and 4a and form a magnetic field. For example, the plate-shaped electrodes 3a and 4a can be composed of stainless steel, but may be composed of metal such as aluminum (Al), titanium (Ti), niobium (Nb), tantalum (Ta), or zirconium (Zr). The magnets 3b and 4b are each composed of a plurality of permanent magnets (e.g., neodymium magnets or the like) each having a pair of S-pole and N-pole, and adjacent magnets have different magnetization directions. The magnets 3b and 4b form the magnetic field G in a space of the plasma processing apparatus, and thus the first discharge electrode unit 3 and the second discharge electrode unit 4 can generate a high-density plasma. The first discharge electrode unit 3 and the second discharge electrode unit 4 with such a configuration are electrically connected to respective both ends of the AC power source 5. The magnetic field G formed by the magnets 3b and 4b preferably have a ring shape (doughnut shape) in plan view (when viewed from above in the figure).

As will be described later in detail, the first discharge electrode unit 3 and the second discharge electrode unit 4 are configured to be switched by the high-frequency power supplied from the AC power source 5 so that when one of the first discharge electrode unit 3 and the second discharge electrode unit 4 functions as a cathode, the other of the first discharge electrode unit 3 and the second discharge electrode unit 4 functions as an anode. The first discharge electrode unit 3 and the second discharge electrode unit 4 having such a configuration are electrically connected to the AC power source 5 without being grounded.

The AC power source 5 is a plasma generation power source for supplying a predetermined high-frequency power to the first discharge electrode unit 3 and the second discharge electrode unit 4. By supplying high-frequency AC power to the first discharge electrode unit 3 and the second discharge electrode unit 4, a state is formed in which one discharge electrode unit is a cathode, the other discharge electrode unit is an anode, and charged particles move back and forth between the first discharge electrode unit 3 and the second discharge electrode unit 4 (see FIGS. 1(a) and (b)). That is, magnetron discharge is alternately performed from the first discharge electrode unit 3 and the second discharge electrode unit 4 using a high-frequency signal from the AC power source 5.

The high-frequency power supplied from the AC power source 5 is, for example, 3 kW or more. In the film processing apparatus 1, the AC power source 5 may supply a predetermined power to the first discharge electrode unit 3 and the second discharge electrode unit 4 so that an electrode width (an electrode length in the feeding direction) and the processing intensity Epd, used for plasma processing, per processing speed are 100 [W·s/m²] or more. "Epd" can be expressed by the following equation (1) or (2), where the treatment power [W] represents power from the AC power source 5, the electrode width [m] in the film F feeding direction/electrode area [m²] represents an electrode width/electrode area of the discharge electrode unit, and the processing speed [m/s] represents a conveying speed of the film to be subjected to the treatment.

[Equation 2]

$$Epd[W \cdot s/m^2] = \frac{\text{Treatment power}[W] \times \text{Electrode width (film feeding direction)}[m] + \text{Processing speed}[m/s]}{\text{Electrode area}[m^2]} \quad (1)$$

$$= \frac{\text{Treatment power }[W]}{\text{Electrode width (film feeding direction)}[m] \times \text{Processing speed}[m/s]} \quad (2)$$

The electrode areas in equations (1) and (2) refer to the cathode electrode area, but the cathode electrode of the present invention is alternately switched between the electrodes 3a and 4a due to the application of an AC voltage. Accordingly, the electrode area is equal to an area obtained by adding areas of the two electrodes and dividing the result by two. When the electrodes 3a and 4a have the same shape, the electrode area is equal to an area of one of the electrodes 3a and 4a.

A frequency of high-frequency power supplied from the AC power source 5 is, for example, in the range of 1 kHz or more and 400 kHz or less, and more preferably in the range of 10 kHz or more and 100 kHz or less. A large voltage drop occurs on a magnetron electrode surface and a smaller voltage drop occurs on a surface (bottom surface in FIGS. 1A and 1B) side of the film F. According to the film processing apparatus 1; however, a polarity switching process with an AC voltage allows higher power to be supplied to the discharge electrode units. Furthermore, the magnetic field G formed by the magnets generates a plasma in a bridge shape so as to approach the film F. Thus, the film processing apparatus 1 can increase intensity of the treatment to the surface of the film F.

The film F to be subjected to the surface treatment by the film processing apparatus 1 configured as described above is not particularly limited, and may be composed of various known materials. Examples of the film F include a polyester film composed of polyethylene terephthalate (PET), polyethylene naphthalate (PEN), or the like. The film F may be a polyolefin film composed of polyethylene (PE), polypropylene (PP), or the like, a polyamide film composed of nylon-6, nylon-66, or the like, a polystyrene film, a polycarbonate film, a polyimide film, a cellulose film, or the like. The film F may be a stretched film or an unstretched film. The surface of the film F may be subjected to surface treatment such as corona treatment. The film F may contain various additives such as an antistatic agent, an ultraviolet inhibitor, a plasticizer, and a lubricant, and a stabilizer. A thickness of the film F is not particularly limited, but considering processability and the like, for example, the thickness of the film F is preferably in the range of 6 μm to 100 μm.

Next, a method of performing surface treatment of the film F by the above-described film processing apparatus 1 will be described. First, as the treatment method, the film processing apparatus 1 having the apparatus configuration described above is prepared.

Subsequently, for example, one or more inert gases, composed of argon (Ar), helium (He), or nitrogen (N), are introduced into the box 2 of the film processing apparatus 1. The inert gas to be introduced is preferably argon gas which is a noble gas and gaseous. In this case, gas having high reactivity such as oxygen ($O_2$) may also be introduced. Next, when a predetermined gas is introduced, pressure reduction adjustment is performed so that a pressure in the box 2 is, for example, in the range of 0.1 Pa or more and less than 50 Pa. When the pressure is 0.1 Pa or less, discharge is difficult to stabilize and stable surface treatment cannot be performed, whereas when the pressure is 50 Pa or more, a self-bias voltage drops and a sufficient effect from the plasma P cannot be obtained. When the pressure in the box 2 is 40 Pa or more, a magnetic induction effect of the magnets 3b and 4b of the electrodes is slightly reduced. Thus, the pressure in the box 2 is preferably in the range of 1 Pa to 25 Pa.

Figure 2:
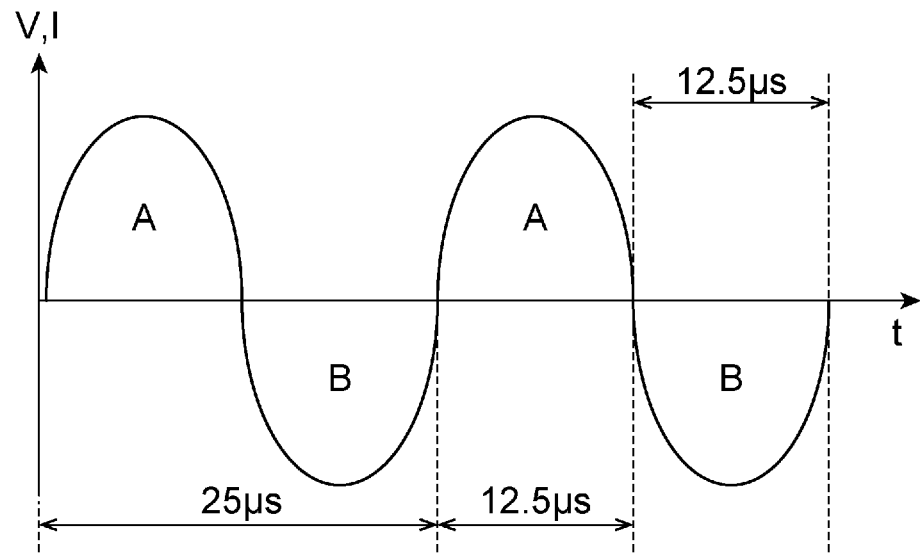
FIG. 2 shows an example of a frequency signal of high-frequency power supplied to discharge electrode units of the film processing apparatus shown in FIGS. 1A and 1B.

Subsequently, a predetermined high frequency power is supplied to the first discharge electrode unit 3 and the second discharge electrode unit 4 from the AC power source 5 functioning as the plasma generation power source in a state where a predetermined inert gas or the like is introduced into the box 2 and adjusted to a predetermined pressure. Thus, an AC voltage is applied to the first discharge electrode unit 3 and the second discharge electrode unit 4. Due to the supply of high-frequency power, discharge is alternately performed by the first discharge electrode unit 3 and the second discharge electrode unit 4 in a predetermined period (e.g., 40 kHz). For example, the frequency of the high-frequency power is preferably in the range of 1 kHz or more and 400 kHz or less, and more preferably in the range of 10 kHz or more and 100 kHz or less. For example, as shown in FIG. 2, when the frequency is 40 kHz, a period of an AC signal is 25 μs, and polarities of the first discharge electrode unit 3 and the second discharge electrode unit 4 are switched between positive polarity and negative polarity every 12.5 μs so that the polarities of first discharge electrode unit 3 and the second discharge electrode unit 4 are different.

Subsequently, when the plasma P is generated by the first discharge electrode unit 3 and the second discharge electrode unit 4, and the AC power source 5, the film F to be treated is conveyed so as to pass above the first discharge electrode unit 3 and the second discharge electrode unit 4 while the switching of polarities is continued. In this case, a surface of the film F to be subjected to the surface treatment is directed toward the first discharge electrode unit 3 and the second discharge electrode unit 4. A distance from the first discharge electrode unit 3 and the second discharge electrode unit 4 to the film F is preferably in the range of 5 mm or more and 100 mm or less, and more preferably in the range of 10 mm or more 50 mm or less. The film F is conveyed in the box 2 so that the distance is in the above range.

The film F passing through the box 2 is fed out at a predetermined conveying speed, and a treatment surface of the film F is subjected to plasma processing. The conveying speed (speed per second) of the film F is, for example, in the range of 2 [m/s] or more and 20 [m/s] or less; however, it is not limited thereto. By such treatment, for example, it is possible to perform pretreatment (adhesion treatment) for vapor deposition by breaking down a crystal structure of the surface of the film F so that the crystal structure becomes amorphous or to perform pretreatment (adhesion treatment) for lamination (including bonding and the like) of another film. The film F may be repeatedly subjected to the plasma processing described above (e.g., the same treatment may be repeated two to three times).

The state of a C—C bond as a film modification effect in the treatment method of the film F according to an embodiment of the present invention can be seen from a spectrum of X-ray photoelectron spectroscopy measurement of the film surface. For example, when the film F is a polyethylene-terephthalate film, the treatment described above is preferably performed so that a half-width of the C—C bond obtained from C1s waveform separation in the X-ray photoelectron spectroscopy measurement of the film surface is in the range of 1.255 eV or more and 1.585 eV or less (under measurement conditions for the X-ray photoelectron spectroscopy measurement where an X-ray source is MgKα and the output is 100 W). When a half-width of the C—C bond is in the range of 1.255 eV or more and 1.585 eV or less, it can be shown that the film surface has been sufficiently modified and treated without deterioration. The plasma processing described above may be further performed on a corona treated surface.

When a vapor deposition process is continuously performed, film forming means such as vacuum vapor deposition, sputtering, ion plating, or chemical vapor deposition (CVD) may be used to form a thin-film layer on the treatment surface of the film F subjected to pretreatment for film formation. In consideration of productivity and the like, vacuum vapor deposition is preferably used. As the thin-film layer, for example, a transparent gas barrier layer composed of aluminum oxide or silicon oxide may be formed. The thickness of the thin-film layer serving as the gas barrier layer may vary depending on the application and the configuration, but for example, the thickness of the thin-film layer is preferably in the range of 5 nm to 300 nm. When the film thickness is less than 5 nm, the film thickness is not sufficient, and the thin-film layer does not function as the gas barrier layer. On the other hand, when the film thickness exceeds 300 nm, flexibility cannot be maintained and the thin film is liable to crack. This also leads to the decrease in productivity. In consideration of performance and productivity, a film thickness of 10 nm to 200 nm is more preferable. By forming a chamber for performing the vapor deposition process so that the chamber is continuous or integrated with the film processing apparatus 1, an in-line process (a process within the same system) may be performed to increase productivity. A gas barrier coating layer may be formed on the vapor-deposited layer, and a protective layer may be further provided thereon.

Figure 3A:
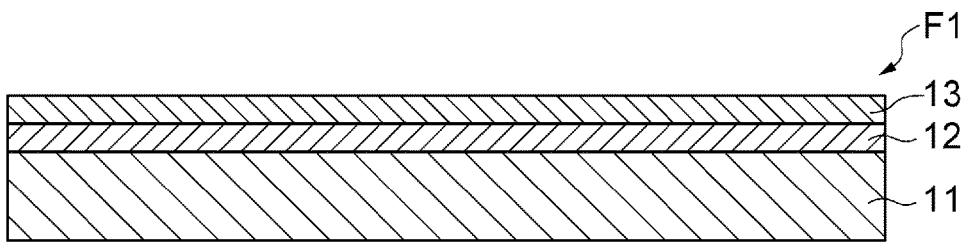
FIGS. 3A, 3B, and 3C are set of cross-sectional views in which 3A, 3B, and 3C show an example of a laminate film including a vapor-deposited layer, manufactured by the film processing apparatus shown in FIGS. 1A and 1B.
Figure 3B:
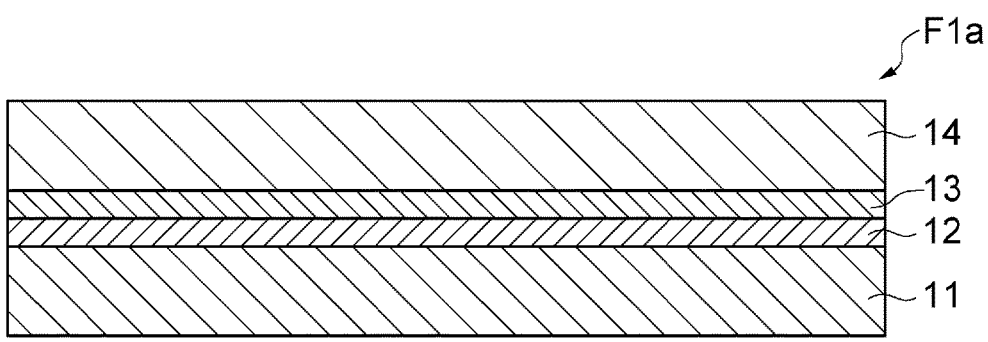
Figure 3C:
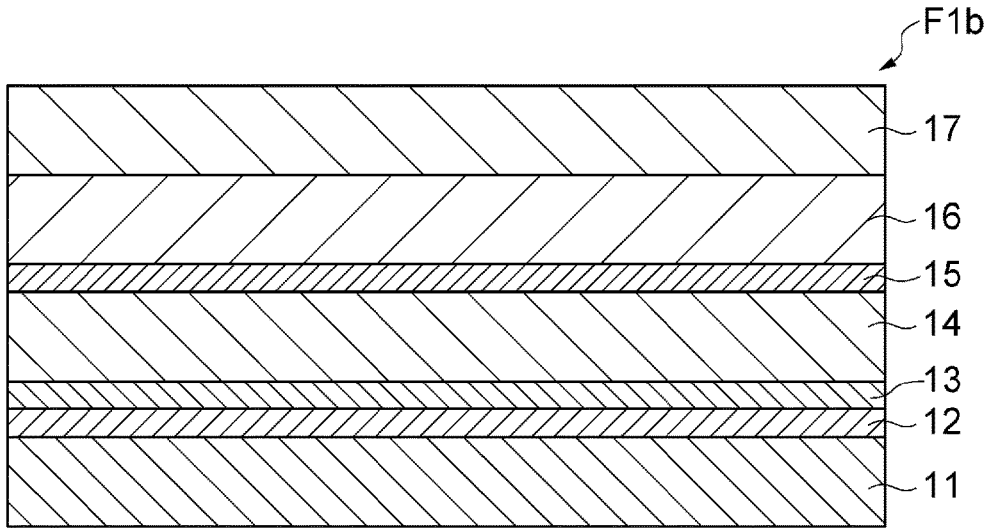

FIGS. 3A, 3B, and 3C show an example of a laminate film formed by performing such a vapor deposition process. As shown in FIG. 3A, an adhesion treatment layer 13 is formed by the above-described plasma processing on the corona treated layer 12 formed on one surface of the PET film 11, to form a film F1. Then, as shown in FIG. 3B, a vapor-deposited layer 14 (e.g., an aluminum oxide layer or the like) is formed on the adhesion treatment layer 13 to form a film F1a including a vapor-deposited layer. As shown in FIG. 3C, a laminate film F1b may be obtained by further sequentially laminating, on the vapor-deposited layer 14 of the film F1a, a gas barrier coating layer 15, a first outer surface layer 16 (e.g., a nylon layer or the like), and a second outer surface layer 17 (e.g., a CPP (Cast Polypropylene) layer or the like). The first outer surface layer 16 may have, for example, a thickness in the range of 10 to 50 μm. The second outer surface layer 17 may be composed of cast polypropylene (CPP), or may be composed of low-density polyethylene (LDPE), linear low-density polyethylene (LLDPE), ethylene-vinyl acetate copolymer resin (EVA), ionomer, acrylic copolymer resin, or the like. As described above, it is preferable to perform the treatment so that the half-width of the C—C bond obtained from the C1s waveform separation in the X-ray photoelectron spectroscopy measurement of the film surface is in the range of 1.255 eV or more and 1.585 eV or less in order to improve the adhesion to the vapor-deposited layer by the modification effect of the film treated surface and to maintain barrier performance when used as a barrier film. Furthermore, the treatment may be performed so that the half-width of the C—C bond obtained from C1s waveform separation in the X-ray photoelectron spectroscopy measurement of the film surface is in the range of 1.255 eV or more and 1.560 eV or less.

Figure 4A:
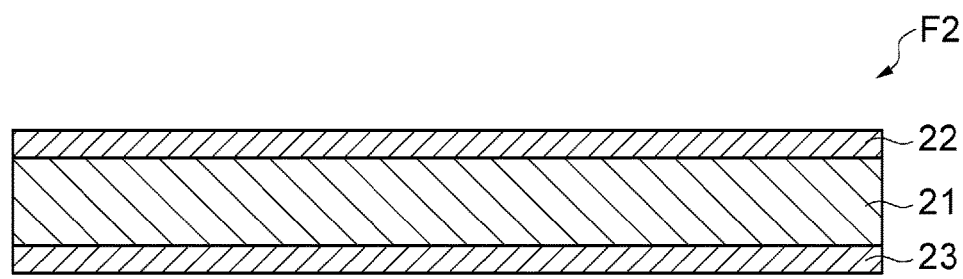
FIGS. 4A and 4B are a set of cross-sectional views in which 4A and 4B show an example of a laminate film on which another layer is laminated, manufactured by the film processing apparatus shown in FIGS. 1A and 1B.
Figure 4B:
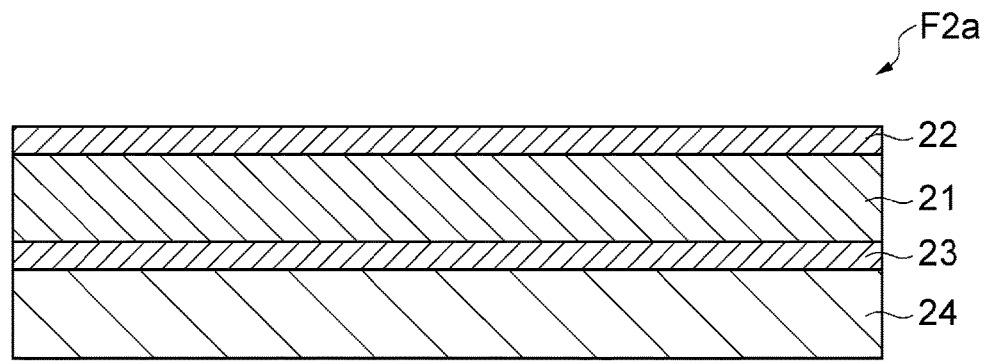

When subsequent to the pretreatment of the film F, a process of laminating (including bonding) another film is performed, another layer may be laminated on the film F, for example, by extrusion molding a material for constituting another layer such as a thermoplastic resin layer on the treatment surface of the film F using an extruder or the like. FIGS. 4A and 4B show an example of a laminate film formed by performing such pretreatment for lamination. In the example shown in FIG. 4A, an adhesion treatment layer 23 is formed by the plasma processing described above on a side opposite to a corona treatment layer 22 formed on one surface of a PET film 21 to form a film F2. Then, as shown in FIG. 4B, a film F2a on which another layer is laminated is obtained by laminating a thermoplastic resin layer 24 extruded from the extruder on the adhesion treatment layer 23. On a side (corona treatment layer 22 side) opposite to the surface subjected to the lamination process, the vapor-deposited layer 14 as shown in FIGS. 3A, 3B, and 3C may be separately formed. Alternatively, between the vapor-deposited layer which is a barrier layer and the PET film which is a substrate, a reactive ion etching treatment layer, an anchor coat layer, or the like may be formed so that the vapor-deposited layer and the PET film are laminated. In the example in FIGS. 4A and 4B, the corona treatment layer 22 is provided on the side opposite to the surface subjected to the lamination process, but the corona treatment layer 22 does not necessarily need to be provided. As described above, it is preferable to treat the film surface so that the half-width of the C—C bond obtained from the C1s waveform separation in the X-ray photoelectron spectroscopy measurement is in the range of 1.255 eV or more and 1.585 eV or less in order to improve the adhesion to a thermoplastic resin such as a polyolefin film such as polyethylene or polypropylene by the modification effect of the film treated surface. Furthermore, for example, a thermoplastic resin may be used such as adhesive polyolefin obtained by introducing a functional group into polyolefin by graft polymerization of maleic anhydride or the like.

As has been described, in the film processing method according to the present embodiment, the two discharge electrode units are used to generate the plasma P used for film processing, and high-frequency AC power is supplied to the discharge electrode units. Therefore, according to the method, since polarities of the electrode units are alternately switched in a predetermined period, charge-up from an electric charge generated on the insulating layer or the like deposited on an electrode surface is suppressed, and thus arcing is less likely to occur. Furthermore, since charge-up is suppressed, higher power can be supplied to each discharge electrode unit. Accordingly, the number of ions increases in a plasma irradiated to a film surface, and thus the process can be accelerated. Therefore, the film processing method according to the present embodiment can improve film throughput and allow a stable plasma processing operation.

In the film processing method, the frequency of high-frequency power may be in the range of 1 kHz or more and 400 kHz or less, and preferably in the range of 10 kHz or more and 100 kHz or less. In this case, since polarities of the first discharge electrode unit and the second discharge electrode unit are preferably switched, charge-up of each discharge electrode units can be preferably suppressed. Because the charge-up is suppressed, abnormal discharge such as arc discharge does not occur, and high electrical power can be supplied.

In the film processing method, the first discharge electrode unit and the second discharge electrode unit each include the plate electrode, and the first discharge electrode unit and the second discharge electrode unit are arranged in parallel. Therefore, a plate-shaped magnetron plasma processing apparatus can be used, and thus the apparatus configuration can be simplified. Further, since the film to be processed is processed in a flat condition, the treatment can be more uniform. In addition, the film is exposed to the plasma for a longer period of time than when the film is conveyed on a roll and subjected to the treatment, and this allows more efficient treatment.

In the film processing method, the AC power source may also supply power as high-frequency power to the first discharge electrode unit and the second discharge electrode unit so that an electrode width in a film width direction and a processing intensity Epd, used for plasma processing, per processing speed are 100 [W·s/m$^2$] or more. In this case, a drop voltage on the film surface can be increased, and this allows more reliable plasma processing of the film to be processed.

The plasma processing apparatus used in the film processing method includes the first discharge electrode unit and the second discharge electrode unit each including the magnet that produces a magnetic field, and the AC power source capable of alternately switching polarities of the first discharge electrode unit and the second discharge electrode unit. The plasma processing apparatus can achieve miniaturization of a treatment apparatus including a vapor deposition apparatus and the like and stabilization of operation of the treatment apparatus.

In the film processing apparatus, the first discharge electrode unit and the second discharge electrode unit each include the plate electrode, and the first discharge electrode unit and the second discharge electrode unit are arranged in parallel. Thus, a plate-shaped magnetron plasma processing apparatus can be used, and thus the apparatus configuration can be simplified.

The embodiment of the present invention has been described in detail, but the present invention is not limited to the embodiment, and various modifications can be applied. For example, the film processing apparatus described above includes the first discharge electrode unit 3 and the second discharge electrode unit 4 each including the plate-shaped electrode; however, instead, two discharge electrode units each including a cylindrical electrode (a rotary cathode) may be used. In this case, in the first discharge electrode unit 3 and the second discharge electrode unit 4, instead of the plate electrodes 3a and 4a, two cylindrical electrodes are arranged to cover the magnets. The magnetron plasma processing apparatus including the cylindrical electrodes can also achieve the film processing method described above. In this case, it is clear that a cylinder height of the electrode portion corresponds to the electrode width in the film width direction.

EXAMPLES

The present invention will be more specifically described below based on Examples and Comparative Examples; however, the present invention should not be limited to the following Examples.

Example 1

First, the plate-shaped magnetron plasma processing apparatus shown in FIGS. 1A and 1B was prepared, and a PET film as a film to be processed was prepared. One side of the PET film had been subjected to corona treatment.

Next, argon (Ar) gas was introduced into the magnetron plasma processing apparatus having an AC power source at a flow rate of 250 [sccm], and a predetermined pressure reduction was performed. A frequency of high-frequency power from the AC power source was set to 40 kHz, and a plasma for plasma processing was generated.

Subsequently, in the magnetron plasma processing apparatus in which the plasma was generated, the PET film was inserted and conveyed so that a surface on a side opposite to the surface of the PET film subjected to the corona treatment was directed toward the discharge electrode units, and the surface directed toward the discharge electrode units was subjected to adhesion treatment by plasma processing. The conveying speed of the PET film was 15 [m/s]. A treatment intensity index Epd of the plasma used in this case was 219 [W·s/m$^2$]. Thus, a film according to Example 1 was produced (see the film F2 in FIG. 4A for layer configuration). A distance from the first discharge electrode unit and the second discharge electrode unit to the film was 25 mm.

Example 2

In Example 2, a PET film similar to that of Example 1 was used, the conveying speed of the film was changed to 2 [m/s], and the power from the AC power source was set so that the treatment intensity index Epd of the plasma was 492 [W·s/m$^2$]. Thus, the PET film was subjected to adhesion treatment. Other conditions and the like of Example 2 were similar to those of Example 1.

Example 3

In Example 3, a PET film similar to that of Example 1 was used, and the flow rate of argon gas to be introduced was changed to 5000 [sccm] to perform the adhesion treatment. Other conditions and the like of Example 3 were similar to those of Example 1. For example, as in Example 1, the treatment intensity index Epd of the plasma was 219 [W·s/m$^2$].

Example 4

In Example 4, a PET film similar to that of Example 1 was used, the conveying speed of the film was changed to 4 [m/s], and the power from the AC power source was set so that the treatment intensity index Epd of the plasma was 2869 [W·s/m$^2$]. Thus, the PET film was subjected to adhesion treatment. Other conditions and the like of Example 4 were similar to those of Example 1.

Example 5

In Example 5, a PET film similar to that of Example 1 was used, the conveying speed of the film was changed to 2 [m/s], and the power from the AC power source was set so that the treatment intensity index Epd of the plasma was 5738 [W·s/m$^2$]. Thus, the PET film was subjected to adhesion treatment. Other conditions and the like of Example 5 were similar to those of Example 1.

Evaluation of Occurrence of Arc Discharge

When the PET films of Examples 1 to 5 were subjected to plasma processing for two hours, it was confirmed that arc discharge did not occur. This is assumed to be because polarities of the discharge electrodes were alternately switched by the AC power source.

Evaluation of First Adhesion

Next, as an evaluation of adhesion of the PET films subjected to the treatment according to Examples 1 to 5, surface composition (XPS) of the treatment surface of the films was analyzed. As the analysis by XPS, a half-width (FWHM) of a C—C bond peak was measured, and it was evaluated whether the FWHM value was within a practically preferable range which is in the range of 1.255 [eV] or more and 1.585 [eV] or less was performed. More specifically, the FWHM value indicated the half-width of the C—C bond peak in C1s waveform separation when X-ray photoelectron spectroscopy measurement was performed. The treatment surface of the film of Example 1 had a FWHM value of 1.278 [eV], the treatment surface of the film of Example 2 had a FWHM value of 1.356 [eV], the treatment surface of the film of Example 3 had a FWHM value of 1.269 [eV], the treatment surface of the film of Example 4 had a FWHM value of 1.498 [eV], and the treatment surface of the film of Example 5 had a FWHM value of 1.522 [eV]. Thus, it was confirmed that all the films had adhesion in the preferable range mentioned above. As Comparative Example 1, in a normal PET film (subjected to only corona treatment), a corona treated surface had a FWHM value of 1.208 [eV] and a surface not subjected to the corona treatment had a FWHM value of 1.172 [eV], and thus the FWHM values were much lower than the lower limit of 1.255 [eV] within the preferred range described above.

Table 1 shows the conditions and the evaluation results of Examples 1 to 5, Comparative Example 1-1 (corona treated surface), and Comparative Example 1-2 (non-corona treated surface).

TABLE 1

|  | Ar flow rate [sccm] | Conveying speed [m/s] | Epd [W · s/m$^2$] | FWHM [eV] |
|---|---|---|---|---|
| Example 1 | 250 | 15 | 219 | 1.278 |
| Example 2 | 250 | 2 | 492 | 1.356 |
| Example 3 | 5000 | 15 | 219 | 1.269 |
| Example 4 | 250 | 4 | 2869 | 1.498 |
| Example 5 | 250 | 2 | 5738 | 1.522 |

TABLE 1-continued

|  | Ar flow rate [sccm] | Conveying speed [m/s] | Epd [W · s/m$^2$] | FWHM [eV] |
|---|---|---|---|---|
| Comparative Example 1-1 | — | — | — | 1.208 |
| Comparative Example 1-2 | — | — | — | 1.172 |

Evaluation of Second Adhesion

As another evaluation of adhesion of the PET films subjected to the adhesion treatment according to Examples 1 to 5, polyethylene (PE) was extrusion molded to have a thickness of 15 μm on the treatment surface of each PET film subjected to the treatment by an extruder, and the actual degree of adhesion between each PET film and the PE layer was measured when an LLDPE film having a thickness of 40 μm was sandwich laminated on the PE surface (see the film Fla in FIG. 4B for layer configuration). As Comparative Example 1-1, polyethylene was extrusion molded to have a thickness of 15 μm on the corona treated surface of a normal PET film (subjected to only corona treatment) by an extruder, and the actual degree of adhesion between each PET film and the PE layer was measured when an LLDPE film having a thickness of 40 μm was sandwich laminated on the PE surface. As Comparative Example 1-2, polyethylene was extrusion molded to have a thickness of 15 μm on the surface (untreated surface) on a side opposite to the corona treated surface of the normal PET film (subjected to only corona treatment) by an extruder, and the actual degree of adhesion between each PET film and the PE surface was measured when an LLDPE film having a thickness of 40 μm was sandwich laminated on the PE surface.

The degree of adhesion was measured in accordance with JIS K 6854-2 (180-degree peel) and JIS K 6854-3 (T-peel). The test was conducted under two measurement conditions: the normal condition (Dry) and the condition with application of water (Wet). Under the condition (Wet), the peel test was performed while water was sufficiently applied to the peeling portion. Table 2 shows the results.

TABLE 2

|  |  | Adhesive strength [N/15 mm] Dry | Adhesive strength [N/15 mm] Wet |
|---|---|---|---|
| Example 1 | T-peel | 6.1 | 1.5 |
|  | 180-degree peel | 6.3 | 1.3 |
| Example 2 | T-peel | 6.7 | 1.9 |
|  | 180-degree peel | 6.0 | 1.2 |
| Example 3 | T-peel | 6.8 | 1.7 |
|  | 180-degree peel | 6.4 | 1.2 |
| Example 4 | T-peel | 6.5 | 1.8 |
|  | 180-degree peel | 6.7 | 1.2 |
| Example 5 | T-peel | 6.7 | 1.9 |
|  | 180-degree peel | 6.2 | 1.2 |
| Comparative Example 1-1 (corona treated surface covered with PE) | T-peel | 2.4 | 0.3 |
|  | 180-degree peel | 2.1 | 0.2 |
| Comparative Example 1-2 (untreated surface) | T-peel | 0.5 | 0.4 |
|  | 180-degree peel | 0.2 | 0.2 |

As is clear from the above-described Table 2, it was confirmed that in the films according to Examples 1 to 5 in which the treatment surface subjected to the plasma treatment was covered with the PE layer, the adhesive strength (DRY) was 6.0 [N/15 mm] or more. Furthermore, it was confirmed that in Examples 1 to 5, even in the Wet case, which is a more severe condition, the adhesive strength was 1.2 [N/15 mm] or more. On the other hand, in the films according to Comparative Examples 1-1 and 1-2, the maximum adhesive strength (DRY) was 2.4 [N/15 mm] and the maximum adhesive strength (Wet) was 0.4 [N/15 mm], both indicating extremely low adhesion.

Evaluation of Third Adhesion

As still another evaluation of adhesion of the PET films subjected to the adhesion treatment according to Examples 1 to 5, on the treatment surface of the PET films subjected to the treatment, maleic anhydride-modified polyethylene adhesive resin (hereinafter referred to as "adhesive resin") and polyethylene (PE) were coextrusion molded by using the extruder so that the adhesive resin had a thickness of 10 μm and the polyethylene had a thickness of 20 μm, and furthermore, on the PE surface, an LLDPE film having a thickness of 30 μm was sandwich laminated, and then the actual degree of adhesion between each PET film and the adhesive resin layer was measured. As Comparative Example 1-1, the adhesive resin and polyethylene were coextrusion molded by an extruder so that the thickness of the adhesive resin would be 10 μm and the thickness of the polyethylene would be 20 μm on the corona treated surface of a normal PET film (subjected to only corona treatment), and the actual degree of adhesion between the PET film and the adhesive resin layer was measured when an LLDPE film having the thickness of 30 μm was sandwich laminated on the PE surface. As Comparative Example 1-2, the adhesive resin and polyethylene were coextrusion molded by an extruder so that the thickness of the adhesive resin would be 10 μM and the thickness of the polyethylene would be 20 μm on the surface (untreated surface) on the side opposite to the corona treated surface of a normal PET film (subjected to only corona treatment), and the actual degree of adhesion between the PET film and the adhesive resin layer was measured when an LLDPE film having a thickness of 30 μm was sandwich laminated on the PE surface.

The degree of adhesion was measured in accordance with JIS K 6854-2 (180-degree peel) and JIS K 6854-3 (T-peel). The test was conducted under two measurement conditions: the normal condition (Dry) and the condition with application of water (Wet). Under the condition (Wet), the peel test was performed while water was sufficiently applied to the peeling portion. Table 3 shows the results.

TABLE 3

| | | Adhesive strength [N/15 mm] Dry | Adhesive strength [N/15 mm] Wet |
|---|---|---|---|
| Example 1 | T-peel | 7.5 | 3.1 |
| | 180-degree peel | 6.8 | 3.6 |
| Example 2 | T-peel | 8.5 | 3.2 |
| | 180-degree peel | 7.7 | 3.5 |
| Example 3 | T-peel | 7.9 | 4.6 |
| | 180-degree peel | 7.5 | 3.5 |
| Example 4 | T-peel | 7.4 | 3.0 |
| | 180-degree peel | 7.1 | 2.9 |
| Example 5 | T-peel | 8.9 | 4.2 |
| | 180-degree peel | 8.3 | 3.8 |
| Comparative Example 1-1 (corona treated surface covered with PE) | T-peel | 2.5 | 0.5 |
| | 180-degree peel | 2.0 | 0.3 |
| Comparative Example 1-2 (untreated surface) | T-peel | 0.6 | 0.3 |
| | 180-degree peel | 0.3 | 0.2 |

As clear from the above-described Table 3, it was confirmed that in the films according to Examples 1 to 5 in which the treatment surface subjected to the treatment using plasma was covered with the adhesive resin layer, the adhesive strength (DRY) was 6.0 [N/15 mm] or more. Furthermore, it was confirmed that in Examples 1 to 5, even in the Wet case, which is a more severe condition, the adhesive strength was 2.9 [N/15 mm] or more. On the other hand, in the films according to Comparative Examples 1-1 and 1-2, the maximum adhesive strength (DRY) was 2.5 [N/15 mm] and the maximum adhesive strength (Wet) was 0.5 [N/15 mm], both indicating extremely low adhesion.

Example 6

Next, the plate-shaped magnetron plasma processing apparatus used to produce the films according to Example 1 and the like was used to form a vapor-deposited layer on a similar PET film (one of the surfaces had been subjected to corona treatment).

First, argon (Ar) gas at a flow rate of 250 [sccm] and oxygen ($O_2$) at a flow rate of 1000 [sccm] were introduced (introduced at 1250 [sccm] in total) into the magnetron plasma processing apparatus having the AC power source, and a predetermined pressure reduction was performed. A frequency of high-frequency power from the AC power source was set to 40 [kHz], and plasma for plasma processing was generated.

Subsequently, in the magnetron plasma processing apparatus in which the plasma was generated, the PET film was inserted and conveyed so that the surface subjected to the corona treatment was directed toward the discharge electrode units, and the surface was subjected to adhesion treatment by treatment using plasma. The conveying speed of the PET film was 2 [m/s]. The treatment intensity index Epd of the plasma used in this case was 4098 [W·s/m$^2$]. Thus, a film according to Example 6 was produced (see the film F1 in FIG. 3A for layer configuration).

Example 7

In Example 7, a PET film similar to that of Example 6 was used, and the conveying speed of the film was changed to 4

[m/s]. Thus, the PET film according to Example 7 was subjected to adhesion treatment. Other conditions and the like of Example 7 were similar to those of Example 6. The treatment intensity index Epd of the plasma used in this case was 2049 [W·s/m²].

Example 8

In Example 8, a PET film similar to that of Example 6 was used, and only argon gas at a flow rate of 250 [sccm] was introduced into the box (chamber) as an introducing gas, and a predetermined pressure reduction was performed to perform an adhesion treatment of the PET film according to Example 8. Other conditions and the like of Example 8 were similar to those of Example 6. The treatment intensity index Epd of the plasma used in this case was 4098 [W·s/m²].

Example 9

In Example 9, a PET film similar to that of Example 6 was used, and as the introduced gas, only argon gas was introduced at a flow rate of 250 [sccm] into the box (chamber) and a predetermined pressure reduction was performed. Furthermore, the conveying speed of the film was changed to 4 [m/s]. Thus, the PET film according to Example 9 was subjected to adhesion treatment. Other conditions and the like of Example 9 were similar to those of Example 6. The treatment intensity index Epd of the plasma used in this case was 2049 [W·s/m²].

Evaluation of Occurrence of Arc Discharge

When the PET films of Examples 6 to 9 were subjected to the plasma processing for two hours, it was confirmed that arc discharge did not occur. This is assumed to be because polarities of the discharge electrodes were alternately switched by the AC power source.

Evaluation of First Adhesion

Next, as an evaluation of adhesion of the PET films subjected to the treatment according to Examples 6 to 9, surface composition (XPS) of the treatment surface of the films was analyzed. As the analysis by XPS, a half-width (FWHM) of a C—C bond peak was measured, and it was evaluated whether the FWHM value was within a practically preferable range which was in the range of 1.255 [eV] or more and 1.560 [eV] or less. The treatment surface of the film of Example 6 had a FWHM value of 1.330 [eV], the treatment surface of the film of Example 7 had a FWHM value of 1.322 [eV], the treatment surface of the film of Example 8 had a FWHM value of 1.512 [eV], and the treatment surface of the film of Example 9 had a FWHM value of 1.410 [eV]. Thus, it was confirmed that all the films had adhesion in the required range. As Comparative Example 2, in a normal PET film (subjected to only corona treatment), as in Comparative Example 1, a corona treated surface had a FWHM value of 1.208 [eV], and thus the FWHM value was lower than 1.255 [eV], which was a lower limit of the preferable range mentioned above.

Table 4 shows the conditions and the evaluation results of Examples 6 to 9 and Comparative Example 2.

TABLE 4

|  | Ar/O₂ gas flow rate [sccm] | Conveying speed [m/s] | Epd [W · s/m²] | FWHM [eV] |
|---|---|---|---|---|
| Example 6 | 250/1000 | 2 | 4098 | 1.330 |
| Example 7 | 250/1000 | 4 | 2049 | 1.322 |
| Example 8 | 250/0 | 2 | 4098 | 1.512 |
| Example 9 | 250/0 | 4 | 2049 | 1.410 |
| Comparative Example 2 | — | — | — | 1.208 |

Evaluation of Second Adhesion

As another evaluation of adhesion of the PET films subjected to the treatment according to Examples 6 to 9, aluminum oxide was deposited on the treatment surface of each PET films subjected to the treatment by vacuum vapor deposition so that the thickness of the aluminum oxide became 15 nm, and a vapor-deposited layer was formed by lamination on an adhesion layer of the PET films subjected to the treatment according to Examples 6 to 9. Further, a gas barrier coating layer containing a mixture of polyvinyl alcohol and silicon oxide was laminated and formed thereon. Furthermore, on the gas barrier coating layer, as retort laminates, a first outer surface layer (nylon layer having a thickness of 15 μm) and a second outer surface layer (CPP having a thickness of 70 μm) were laminated by dry lamination (see the laminate film F1b in FIG. 3C for layer configuration). As Comparative Example 2, on the corona treated surface of the normal PET film (subjected to only corona treatment), aluminum oxide was deposited by vacuum vapor deposition to have a thickness of 15 nm, so that a vapor-deposited layer was formed by lamination on the PET film according to Comparative Example 2. As in Examples 6 to 9, on the vapor deposition layer, a gas barrier coating layer was formed by lamination. Furthermore, as in Examples 6 to 9, on the gas barrier coating layer, a first outer surface layer (nylon layer having a thickness of 15 μm) and a second outer surface layer (CPP having a thickness of 70 μm) were laminated by dry lamination. Then, the actual degree of adhesion between the PET film and the aluminum oxide layer was measured.

The degree of adhesion was measured in accordance with JIS K 6854-2 (180-degree peel) and JIS K 6854-3 (T-peel). The tests were performed under two measurement conditions: the normal condition (Dry) and the condition with application of water (Wet). Both conditions were performed in a room having a temperature of 40 degrees and humidity of 90%, and the changes over time (before retort treatment, immediately after retort treatment, 1 month later, and 3 months later) were observed. Under the condition (Wet), the peel test was performed while water was sufficiently applied to the peeling portion. In the retort treatment, a four-sided pouch (size: 150×200 mm) was produced and filled with 200 g of water, and then the pouch was subjected to the retort treatment at 121 degrees for 60 minutes in a hot-water storage type retort oven. The measurement for the degree of adhesion immediately after the retort treatment was performed within 2 hours after the treatment. Table 5 shows the results.

TABLE 5

| | | Adhesive strength [N/15 mm] | | | | Adhesive strength [N/15 mm] | | | |
| | | Dry | | | | Wet | | | |
| | | Beginning | Immediately after retort | 1 month later | 3 months later | Before retort | Immediately after retort | 1 month later | 3 months later |
|---|---|---|---|---|---|---|---|---|---|
| Example 6 | T-peel | 3.8 | 2.8 | 3.6 | 3.4 | 1.9 | 0.6 | 2.0 | 2.0 |
| | 180-degree peel | 3.1 | 2.6 | 3.4 | 3.5 | 1.6 | 0.9 | 1.8 | 2.1 |
| Example 7 | T-peel | 4.0 | 3.0 | 3.7 | 3.5 | 1.6 | 0.6 | 1.9 | 2.1 |
| | 180-degree peel | 3.6 | 2.9 | 3.4 | 3.3 | 1.7 | 1.0 | 1.7 | 2.0 |
| Example 8 | T-peel | 4.0 | 3.3 | 3.6 | 3.4 | 2.8 | 1.3 | 2.4 | 2.2 |
| | 180-degree peel | 3.7 | 3.2 | 3.3 | 3.5 | 2.0 | 1.5 | 1.8 | 2.2 |
| Example 9 | T-peel | 3.9 | 3.0 | 3.5 | 3.2 | 2.4 | 1.2 | 1.9 | 2.2 |
| | 180-degree peel | 3.6 | 3.0 | 3.5 | 3.4 | 2.2 | 1.2 | 1.9 | 2.1 |
| Comparative Example 2 | T-peel | 2.1 | Interlayer peeling | Interlayer peeling | Interlayer peeling | 0.2 | Interlayer peeling | Interlayer peeling | Interlayer peeling |
| | 180-degree peel | 2.0 | Interlayer peeling | Interlayer peeling | Interlayer peeling | 0.2 | Interlayer peeling | Interlayer peeling | Interlayer peeling |

As clear from Table 5, it was confirmed that when the PET film of Comparative Example 2 was subjected to the retort treatment, interlayer peeling (delamination) occurred, while in the films according to Examples 6 to 9, no interlayer peeling occurred and the adhesion of the aluminum oxide layer to the PET films was maintained. Furthermore, it was confirmed that the adhesion strength was maintained over a long period of time after the retort treatment.

Barrier performance (oxygen permeability) of the films according to Examples 6 to 9 and the film according to Comparative Example 2 was measured. The measurement was performed in accordance with JIS K 7126-2 by means of a measuring device OX-TRAN2/20 manufactured by MOCON, Inc., under measurement condition of 30 degrees and 70% RH. Table 6 shows the measurement results.

TABLE 6

| | Barrier performance (oxygen permeability) [cc/m² · atm · day] | | | |
|---|---|---|---|---|
| | Before retort | Immediately after retort | 1 month later | 3 months later |
| Example 6 | 0.10 | 0.83 | 0.72 | 0.44 |
| Example 7 | 0.11 | 0.95 | 0.62 | 0.49 |
| Example 8 | 0.07 | 0.84 | 0.47 | 0.35 |
| Example 9 | 0.11 | 0.65 | 0.57 | 0.47 |
| Comparative Example 2 | 0.10 | Interlayer peeling | Interlayer peeling | Interlayer peeling |

As clear from Table 6, it was confirmed that a predetermined gas barrier performance was obtained when the gas barrier film was produced by laminating the vapor deposition film having gas barrier performance on the PET films on which the adhesive layer was formed by the treatment method according to Examples 6 to 9. On the other hand, in the PET film according to Comparative Example 2, the vapor-deposited layer having gas barrier performance was peeled off after the retort treatment, and the gas barrier performance could not be maintained.

Industrial Applicability

The present invention is applicable to various film processing methods and film manufacturing methods.

REFERENCE SIGNS LIST

1 . . . Film processing apparatus; 2 . . . Box; 2a . . . Inlet; 2b Outlet; 3 . . . First discharge electrode unit; 3a, 4a . . . Electrode; 3b, 4b . . . Magnet; 4 . . . Second discharge electrode unit; 5 . . . AC power source; 11, 21 . . . PET film; 12, 22 . . . Corona treated layer; 13, 23 . . . Adhesion treatment layer; 14 . . . Vapor-deposited layer; 15 . . . Gas barrier coating layer; 16 . . . First outer surface layer; 17 . . . Second outer surface layer; 24 . . . Thermoplastic resin layer; F, F1, F1a, F2, F2a . . . Film; F1b . . . Laminate film; P . . . Plasma; G . . . Magnetic field.

What is claimed is:

1. A film processing method, comprising the steps of:
preparing a plasma processing apparatus including (a) a vacuum chamber that comprises a first discharge electrode unit and a second discharge electrode unit, and (b) an AC power source, the first discharge electrode unit and the second discharge electrode unit each including a magnet that produces a magnetic field, the AC power source that can electrically connect to the first discharge electrode unit and the second discharge electrode unit and that can alternately switch polarities of the first discharge electrode unit and the second discharge electrode unit; and
conveying a polymer film in a flat condition throughout an entirety of the vacuum chamber of the plasma processing apparatus, wherein the first discharge electrode unit and the second discharge electrode unit are arranged in parallel along a direction of the conveying of the polymer film through the vacuum chamber and each of the first discharge electrode unit and the second discharge electrode unit each includes a planar electrode, which is parallel to a surface of the conveyed polymer film, and
wherein the conveying comprises treating the surface of the conveyed polymer film using a plasma generated in the vacuum chamber between the planar electrode of the first discharge electrode unit and the planar electrode of the second discharge electrode unit by supplying high-frequency power from the AC power source to the first discharge electrode unit and the second discharge electrode unit
and alternately switching polarities of the first discharge electrode unit and the second discharge electrode unit by using the high-frequency power supplied from the AC power source and wherein the treating the surface of the film comprises at least one of ion etching the surface of the film, performing amorphization of the surface substrate surface, or changing a functional group on the surface of the film, wherein the vacuum chamber is a box having a first wall and a second wall, which is parallel to the first wall, the first wall has an inlet and the second wall has an outlet, which is parallel to the inlet and parallel to the first wall and the second wall, wherein the film enters the vacuum chamber through the inlet and exits the vacuum chamber through the outlet while being in the flat condition between the inlet and the outlet, and perpendicular to the first and the second walls.

2. The film processing method of claim 1, wherein a frequency of the high-frequency power is in the range of 1 kHz or more and 400 kHz or less.

3. The film processing method of claim 1, wherein a frequency of the high-frequency power is in the range of 10 kHz or more and 100 kHz or less.

4. The film processing method of claim 1, wherein the AC power source supplies predetermined power to the first discharge electrode unit and the second discharge electrode unit so that an electrode width in a film width direction and a processing intensity Epd, used for the plasma processing, per processing speed are 100 W·s/m$^2$ or more.

5. The film processing method of claim 1, wherein the AC power source supplies a predetermined power to the first discharge electrode unit and the second discharge electrode unit so that an electrode width in a film width direction and a processing intensity Epd, used for the plasma processing, per processing speed are 200 W·s/m$^2$ or more.

6. The film processing method of claim 1, wherein:
the plasma processing apparatus further includes a box in which the first discharge electrode unit and the second discharge electrode unit are arranged; and
the treating the surface of the film comprises introducing an inert gas into the box.

7. The film processing method of claim 6, wherein the treating the surface of the film further comprises introducing oxygen gas into the box.

8. The film processing method of claim 1, wherein:
the film is a polyethylene-terephthalate film; and
wherein a half-width of a C—C bond obtained from C1s waveform separation in X-ray photoelectron spectroscopy measurement of the treated surface of the film after the treating is in a range of 1.255 eV or more and 1.585 eV or less.

9. The film processing method of claim 1, wherein during the treating the surface of the film, a distance from the first discharge electrode unit and the second discharge electrode unit to the film is in the range of 10 mm or more and 50 mm or less.

10. The film processing method of claim 1, wherein during the treating the surface of the film, a conveying speed of the film is in the range of 2 m/s or more and 20 m/s or less.

11. The film processing method of claim 1, wherein the treating the surface of the film is repeatedly performed on the same film twice or more.

12. A film manufacturing method, comprising the steps of:
performing pretreatment for vapor deposition on the film by the film processing method of claim 1; and
forming a vapor-deposited layer on the treated surface of the film subjected to the step of performing pretreatment for the vapor deposition.

13. A film manufacturing method, comprising the steps of:
performing pretreatment for lamination of another layer on the film by the film processing method of claim 1; and
laminating another layer on the treated surface of the film subjected to the step of performing pretreatment for lamination.

14. The method of claim 1, wherein the treating the surface of the film comprises ion etching the surface of the film.

15. The method of claim 1, wherein the treating the surface of the film comprises performing amorphization of the surface of the film.

16. The method of claim 1, wherein the treating the surface of the film comprises changing a functional group on the surface of the film.

17. The method of claim 1, wherein the treating the surface of the film is performed at a pressure from 1 Pa to 25 Pa.

18. The method of claim 1, wherein in each of the first discharge electrode unit and the second discharge electrode unit, the planar electrode is between the magnet of the respective unit and the conveyed polymer film.

19. The method of claim 1, wherein each of the first wall and the second wall consists of sections parallel to each other.

20. The method of claim 1, wherein the first and the second discharge electrodes are the only electrodes in the vacuum chamber.

* * * * *